United States Patent
Wan et al.

(10) Patent No.: US 10,811,626 B2
(45) Date of Patent: Oct. 20, 2020

(54) ELECTROLUMINESCENT DISPLAY DEVICE AND METHOD OF FABRICATING SAME

(71) Applicant: WUHAN CHINA STAR OPTOELECTRONICS SEMICONDUCTOR DISPLAY TECHNOLOGY CO., LTD., Wuhan, Hubei (CN)

(72) Inventors: Kai Wan, Hubei (CN); Xiaohua Zhong, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/320,293

(22) PCT Filed: Dec. 20, 2018

(86) PCT No.: PCT/CN2018/122407
§ 371 (c)(1),
(2) Date: Jan. 24, 2019

(87) PCT Pub. No.: WO2020/098068
PCT Pub. Date: May 22, 2020

(65) Prior Publication Data
US 2020/0152921 A1    May 14, 2020

(30) Foreign Application Priority Data
Nov. 13, 2018 (CN) .......................... 2018 1 1343427

(51) Int. Cl.
*H01L 29/18* (2006.01)
*H01L 21/338* (2006.01)
(Continued)

(52) U.S. Cl.
CPC ........ *H01L 51/5056* (2013.01); *H01L 51/502* (2013.01); *H01L 51/5004* (2013.01);
(Continued)

(58) Field of Classification Search
CPC .......................... H01L 51/502; H01L 51/5004
(Continued)

(56) References Cited

U.S. PATENT DOCUMENTS

| 8,466,366 B2 * | 6/2013 | Srinivas | H01B 1/02 |
| | | | 174/126.1 |
| 9,773,993 B2 * | 9/2017 | Hirosawa | B82Y 20/00 |
| 2011/0168976 A1 * | 7/2011 | Mao | H01L 33/18 |
| | | | 257/13 |

* cited by examiner

*Primary Examiner* — Calvin Lee

(57) ABSTRACT

An electroluminescent display device and a fabricating method thereof are provided. The device has a TFT layer, a first functional layer, an electroluminescent layer, a second functional layer, and a functional bar disposed sequentially. The device uses Seebeck effect of constituent material of p-type $Bi_2Te_3$ of the functional bar to absorb heat of the TFT layer for converting the heat into electric energy, thereby effectively reducing heat of the TFT layer, reducing aging of circuit and organic material, and improving life of the electroluminescent display device. A work function of p-type $Bi_2Te_3$ material of the functional bar is 5.3 eV. An electroluminescent material has a HOMO energy level ranging from 5 to 6 eV. Under a driving of a thermoelectromotive force, majority carriers (holes) in the constituent material of p-type $Bi_2Te_3$, are injected into the electroluminescent layer to improve a carrier concentration therein, thereby improving emission luminance of the electroluminescent display device.

6 Claims, 2 Drawing Sheets

(51) Int. Cl.
  *H01L 51/50* (2006.01)
  *H01L 51/52* (2006.01)
(52) U.S. Cl.
  CPC ........ *H01L 51/504* (2013.01); *H01L 51/5012* (2013.01); *H01L 51/5072* (2013.01); *H01L 51/5092* (2013.01); *H01L 51/5206* (2013.01); *H01L 2227/323* (2013.01); *H01L 2251/5369* (2013.01)
(58) Field of Classification Search
  USPC .............. 438/167, 175; 257/86, 87, 187–190
  See application file for complete search history.

ELECTROLUMINESCENT DISPLAY DEVICE AND METHOD OF FABRICATING SAME

FIELD OF DISCLOSURE

The present disclosure relates to displays, and more particularly to an electroluminescent display device and a method of fabricating the same.

BACKGROUND OF DISCLOSURE

Active-matrix organic light-emitting diode (AMOLED) display panels originate from organic light-emitting diode (OLED) display technology, which has absolute advantages such as flexibility, self-illumination, small panel thickness, and short reaction time, so as to make AMOLED become the most potential display panel to replace TFT-LCD displays.

AMOLEDs are electroluminescent devices. A working principle is that the display panel is driven by an external electric field, and holes are injected from an ITO anode into an electroluminescent layer, and electrons are injected from a metal cathode into the electroluminescent layer. When electrons and holes meet at the electroluminescent layer, they are combined with a certain probability to form excitons (electron-hole pairs) in an excited state under an effect of Coulomb force, and the excited state is unstable in a normal environment. Excited state excitons recombine and transfer energy to the luminescent material, causing it to transition from a ground state level to the excited state. The excited state energy generates photons through a radiation relaxation process, so as to release light energy.

As a typical electroluminescent device, AMOLED displays inevitably generate heat during operation. In addition, AMOLED displays rely on current driving, where their luminous flux is inversely proportional to lifetime and their brightness is proportional to current density. In order to obtain high brightness, it is necessary to design a complicated TFT circuit control current, which inevitably generates high heat, thereby accelerating the aging of the driving circuit and the luminescent layer material, and reducing the service life of the device. Therefore, effective control of the operating temperature of the AMOLED is an important issue to improve performance of the entire display.

To solve this problem, a layer of graphene heat conduction layer can be added between the metal cathode and an AMOLED illuminant, and the heat generated by the AMOLED is transferred to the metal cathode by an ultra-high thermal conductivity of the graphene, because a specific heat of the metal is low, and has a very high good heat dissipation effect. The method has a certain effect on the heat dissipation of the AMOLED light emission, but for an upper light-emitting AMOLED device, the addition of the graphene also affects an effective light extraction percentage of the light-emitting layer to some extent.

Therefore, there is a need to find a new type of electroluminescent display device to solve the above problems.

SUMMARY OF DISCLOSURE

An object of the present disclosure is to provide an electroluminescence display device and a method of fabricating the same, which can solve the problems of high temperature and low device lifetime of the current AMOLED display device.

To solve the above problems, the present disclosure provides an electroluminescent display device including a thin film transistor (TFT) layer, a first functional layer, an electroluminescent layer, a functional bar, and a second functional layer disposed in sequence. The first functional layer is disposed on the TFT layer. The electroluminescent layer is disposed on the first functional layer. The functional bar is disposed in the first functional layer and the electroluminescent layer, wherein the functional bar consists of a p-type $Bi_2Te_3$ material. The second functional layer is disposed on the electroluminescent layer.

Further, a top portion of the functional bar extends upwardly to a location of 0.4-0.6 times of a thickness of the electroluminescent layer.

Further, the first functional layer comprises a ITO anode, a hole injection layer disposed on the ITO anode, and a hole transporting layer disposed on the hole injection layer, all of which are disposed in sequence. The ITO anode is disposed on the TFT layer.

Further, a bottom portion of the functional bar contacts with a surface of the ITO anode.

Further, a number of the functional bar is two or more than two, wherein the functional bars form an array and are uniformly disposed in the first functional layer and the electroluminescent layer.

Further, the electroluminescent layer consists of an electroluminescent material, the electroluminescent material has a HOMO energy level ranging from 5 to 6 eV, and a work function of the p-type $Bi_2Te_3$ material of the functional bar is 5.3 eV.

Further, the second functional layer comprises an electron transporting layer, an electron injection layer, and a metal cathode. The electron transporting layer is disposed on the electroluminescent layer. The electron injection layer is disposed on the electron transporting layer. The metal cathode is disposed on the electron injection layer.

The present disclosure further provides a method of fabricating an electroluminescent display device, comprising: a step S1 of providing a TFT layer; a step S2 of disposing a first functional layer on the TFT layer; a step S3 of disposing an electroluminescent layer on the first functional layer; a step S4 of disposing a template on the first functional layer, depositing a p-type $Bi_2Te_3$ material between the template and the electroluminescent layer, and removing the template by etching to obtain a functional bar; and a step S5 of disposing a second functional layer on the electroluminescent layer.

Further, the template is a porous alumina film.

Further, the depositing comprises one of a chemical deposition and a physical vapor deposition.

An electroluminescent display device relating to the present disclosure has a functional bar consisting of a p-type $Bi_2Te_3$ material. In one aspect, the device uses Seebeck effect of the functional bar to absorb heat of the TFT layer for converting the heat into electric energy, thereby effectively reducing heat of the TFT layer, reducing aging of circuit and organic material; and improving life of the electroluminescent display device. In another aspect, a work function of p-type $Bi_2Te_3$ material of the functional bar is 5.3 eV. An electroluminescent material has a HOMO energy level ranging from 5 to 6 eV. Under a driving of a thermo-electromotive force, majority carriers (holes) in a constituent material of p-type $Bi_2Te_3$ also are injected into the electroluminescent layer to improve a carrier concentration in the electroluminescent layer, so as to improve emission luminance of the electroluminescent display device.

DESCRIPTION OF DRAWINGS

The disclosure is further explained below in conjunction with the drawings and embodiments.

Components in the figure are identified as follows.

| | |
|---|---|
| 1: TFT layer | 3: electroluminescent layer |
| 5: functional bar | |
| 21: ITO anode | 22: hole injection layer |
| 23: hole transporting layer | 41: electron transporting layer |
| 42: electron injection layer | 43: metal cathode |
| 51: hole | |

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as upper, lower, front, back, left, right, top, bottom, etc., are only directions by referring to the accompanying drawings. Thus, the used directional terms are used to describe and understand the present disclosure, but the present disclosure is not limited.

Figure 1:
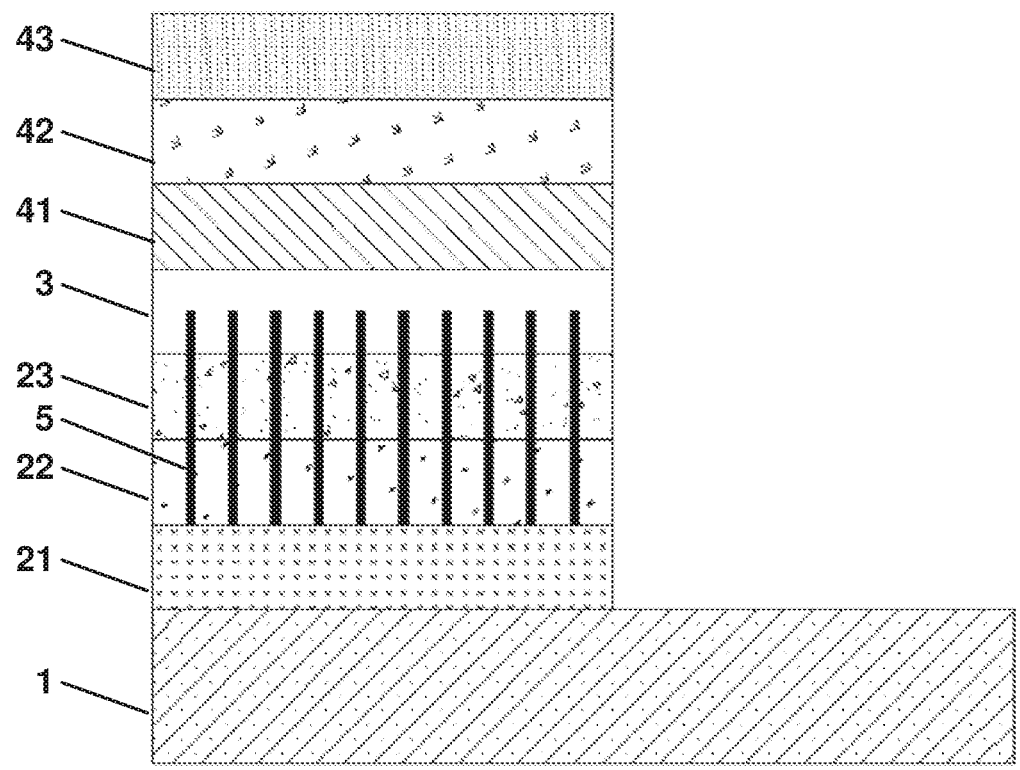
FIG. 1 is a schematic structural diagram of an electroluminescent display device according to an embodiment of the present disclosure.

As shown in FIG. 1, an electroluminescent display device includes a TFT layer 1, a first functional layer, an electroluminescent layer 3, a second functional layer, and a functional bar 5 disposed sequentially. The first functional layer is disposed on the TFT layer 1. The electroluminescent layer 3 is disposed on the first functional layer. The second functional layer is disposed on the electroluminescent layer 3.

The first functional layer comprises a ITO anode 21, a hole injection layer 22, and a hole transporting layer 23. The ITO anode 21 is disposed on the TFT layer 1. The hole injection layer 22 is disposed on the ITO anode 21. The hole transporting layer 23 is disposed on the hole injection layer 22. The ITO anode 21 consists of indium tin oxide (ITO), and the ITO anode 2 made of ITO has good light transmittance. The hole transporting layer 23 controls transporting of holes, thereby controlling the recombination of the holes with electrons in the electroluminescent layer 3, so as to improve a luminous efficiency.

The electroluminescent layer 3 consists of an electroluminescent material, and the electroluminescent material has a HOMO energy level ranging from 5 to 6 eV, wherein the electroluminescent layer 3 can be fabricated by one of vapor deposition, printing, homogeneous deposition, and gas phase synthesis, but is not limited thereto.

The second functional layer comprises an electron transporting layer 41, an electron injection layer 42, and a metal cathode 43. The electron transporting layer 41 is disposed on the electroluminescent layer 3. The electron injection layer 42 is disposed on the electron transporting layer 41. The metal cathode 43 is disposed on the electron injection layer 42. The electron transport layer 41 controls transporting of electrons, thereby controlling recombination of electrons with holes in the electroluminescent layer 3, thereby improving the luminous efficiency.

The functional bar 5 consists of a p-type $Bi_2Te_3$ material, and a work function of the p-type $Bi_2Te_3$ material is 5.3 eV. A bottom portion of the functional bar 5 is disposed in the first functional layer, and a top portion of the functional bar 5 extends upwardly into an interior of the electroluminescent layer 3. Specifically, a bottom portion of the functional bar 5 contacts with a surface of the ITO anode 21. The top portion of the functional bar 5 extends upwardly to a location of 0.4-0.6 times of a thickness of the electroluminescent layer 3. Preferably, the top portion of the functional bar 5 extends upwardly to a location of 0.5 times of the thickness of the electroluminescent layer 3, but is not limited thereto. This allows carrier holes 51 inside the functional bar 5 to enter the electroluminescent layer 3 more uniformly, and the luminous efficiency is more effectively improved.

A number of the functional bar 5 is plural, and the functional bars 5 form an array uniformly disposed inside the first functional layer and the electroluminescent layer 3. The more the number of functional bars, the more heat absorbed by the functional bar 5 under the Seebeck effect, thereby more effectively reducing aging of a circuit and an organic material, and improving a life of the electroluminescent display device. The specific quantity can be determined according to actual needs and is not limited.

Figure 2:
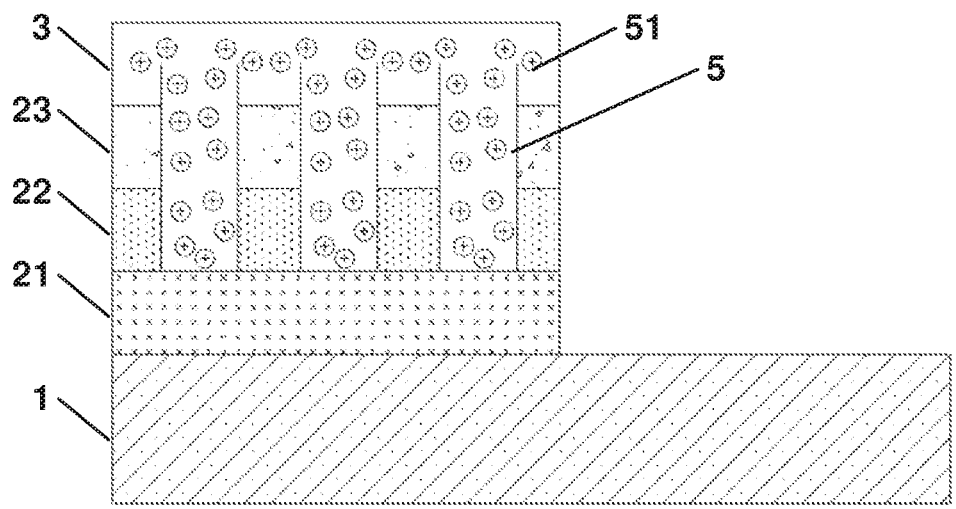
FIG. 2 is a schematic diagram of the electroluminescent display device shown in FIG. 1, which relates to a Seebeck effect and a hole injection of a functional bar.

In operation, as shown in FIG. 2, the TFT layer is energized and heated, and heat is transferred up to the electroluminescent layer 3, thereby forming a temperature difference between the TFT layer and the electroluminescent layer 3. The functional bar 5 generates a Seebeck effect under temperature stimulation, and then begins to absorb high temperature heat and convert the absorbed heat into electrical energy.

In one aspect, this heat absorption and electrical energy conversion reduce temperature and thus reduce the aging of the circuit and the organic material, and improves the life of the electroluminescent display device. In another aspect, it forms a thermoelectromotive force between the TFT layer 1 and the electroluminescent layer 3. Due to a driving of the thermoelectromotive force, the holes 51 in the functional rod 5 are also moved from a high temperature end to a low temperature end, and injected into the electroluminescent layer 3, thereby increasing a carrier concentration in the electroluminescent layer 3, so as to improve luminance of AMOLED.

Further, the P-type $Bi_2Te_3$ material of the functional bar 5 has a work function of 5.3 eV, and the electroluminescent material used in the electroluminescent layer 3 has a HOMO energy level of 5-6 eV. Both the work functions match each other to ensure that carrier holes 51 inside the functional bar 5 can be injected into the electroluminescent layer 3. When the HOMO level of the electroluminescent material is greater than 6 eV, the holes 51 inside the functional bar 5 cannot be injected into the electroluminescent layer 3. When the HOMO level of the electroluminescent material is less than 5 eV, the holes 51 inside the functional bar 5 are also incapable of being injected into the electroluminescent layer 3.

An electroluminescent display device relating to the present disclosure has a functional bar consisting of a p-type $Bi_2Te_3$ material. In one aspect, the device uses Seebeck effect of the functional bar to absorb heat of the TFT layer for converting the heat into electric energy, thereby effectively reducing heat of the TFT layer, reducing aging of circuit and organic material, and improving life of the electroluminescent display device. In another aspect, a work function of p-type $Bi_2Te_3$ material of the functional bar is 5.3 eV. An electroluminescent material has a HOMO energy level ranging from 5 to 6 eV. Under a driving of a thermo-electromotive force, majority carriers (holes) in a constituent material of p-type $Bi_2Te_3$ also are injected into the electroluminescent layer to improve a carrier concentration in the electroluminescent layer, so as to improve emission luminance of the electroluminescent display device.

Figure 3:
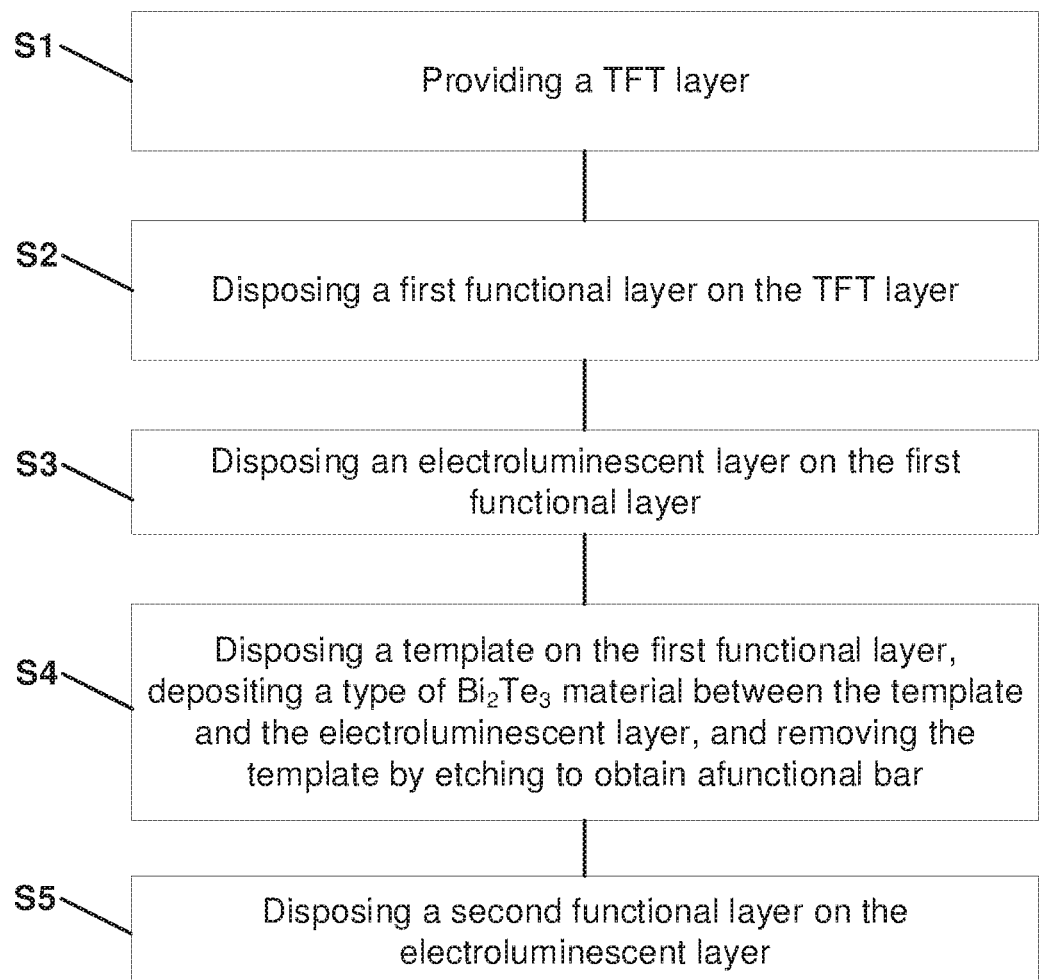
FIG. 3 is a flow chart of fabricating an electroluminescence display device.

As shown in FIG. 3, a method of fabricating an electroluminescent display device, comprising: a step S1 of providing a TFT layer 1; a step S2 of disposing a first functional layer on the TFT layer 1; a step S3 of disposing an electroluminescent layer 3 on the first functional layer; a step S4 of disposing a porous alumina film (AAO) as a template on the first functional layer, depositing a p-type $Bi_2Te_3$ material between the template and the electroluminescent layer 3 by using a chemical deposition method or a physical vapor deposition method, and removing the template by etching, so as to finally obtain a functional bar 5 with a standardized shape and size; and a step S5 of disposing a second functional layer on the electroluminescent layer 3.

The above are only the preferred embodiments of the present disclosure, and are not intended to limit the present disclosure. Any modifications, equivalents, and improvements made within the spirit and scope of the present disclosure are included in the scope of the present disclosure.

The invention claimed is:

1. An electroluminescent display device, comprising:
    a TFT layer;
    a first functional layer disposed on the TFT layer;
    an electroluminescent layer disposed on the first functional layer;
    a functional bar disposed in the first functional layer and the electroluminescent layer,
    wherein the functional bar consists of a p-type $Bi_2Te_3$ material; and
    a second functional layer disposed on the electroluminescent layer,
    wherein the electroluminescent layer consists of an electroluminescent material, the electroluminescent material has a HOMO energy level ranging from 5 to 6 eV, and a work function of the p-type $Bi_2Te_3$ material of the functional bar is 5.3 eV.

2. The electroluminescent display device according to claim 1, wherein the second functional layer comprises:
    an electron transporting layer disposed on the electroluminescent layer;
    an electron injection layer disposed on the electron transporting layer; and
    a metal cathode disposed on the electron injection layer.

3. The electroluminescent display device according to claim 1, wherein a number of the functional bar is two or more than two, wherein the functional bars form an array and are uniformly disposed in the first functional layer and the electroluminescent layer.

4. The electroluminescent display device according to claim 1, wherein a top portion of the functional bar extends upwardly to a location of 0.4-0.6 times of a thickness of the electroluminescent layer.

5. The electroluminescent display device according to claim 1, wherein the first functional layer comprises:
    a ITO anode disposed on the TFT layer;
    a hole injection layer disposed on the ITO anode; and
    a hole transporting layer disposed on the hole injection layer.

6. The electroluminescent display device according to claim 5, wherein a bottom portion of the functional bar contacts with a surface of the ITO anode.

* * * * *